United States Patent
Kromrey et al.

(10) Patent No.: US 10,910,825 B2
(45) Date of Patent: Feb. 2, 2021

(54) INPUT IMPEDANCE MANAGEMENT AND LEAKAGE CURRENT DETECTION

(71) Applicant: Eaton Intelligent Power Limited, Dublin (IE)

(72) Inventors: Timothy Mark Kromrey, Milwaukee, WI (US); Hani Emil Al-Yousef, Oak Creek, WI (US)

(73) Assignee: Eaton Intelligent Power Limited, Dublin (IE)

( * ) Notice: Subject to any disclaimer, the term of this patent is extended or adjusted under 35 U.S.C. 154(b) by 123 days.

(21) Appl. No.: 16/357,793

(22) Filed: Mar. 19, 2019

(65) Prior Publication Data

US 2019/0296542 A1 Sep. 26, 2019

Related U.S. Application Data

(60) Provisional application No. 62/646,001, filed on Mar. 21, 2018.

(51) Int. Cl.
*G01R 31/50* (2020.01)
*H02H 7/22* (2006.01)
(Continued)

(52) U.S. Cl.
CPC ............ *H02H 7/222* (2013.01); *G01R 31/50* (2020.01); *H01H 33/008* (2013.01);
(Continued)

(58) Field of Classification Search
USPC .............................................. 361/42, 61–69
See application file for complete search history.

(56) References Cited

U.S. PATENT DOCUMENTS 7,725,295 B2 5/2010 Stoupis et al.
8,390,302 B2 3/2013 Mousavi et al.
(Continued)

FOREIGN PATENT DOCUMENTS

WO 2006/028968 A1 3/2006

OTHER PUBLICATIONS

Jan Fribert, European International Searching Authority, International Search Report and Written Opinion, counterpart PCT Application No. PCT/EP2019/025074, dated Jun. 24, 2019, 15 pages total.

*Primary Examiner* — Danny Nguyen
(74) *Attorney, Agent, or Firm* — DiBerardino McGovern IP Group LLC

(57) ABSTRACT

A system for an electrical power distribution network includes an electrical apparatus configured to monitor or control one or more aspects of the electrical power distribution network, the electrical apparatus including a contact switch configured to open and close. The system also includes an input apparatus. The input apparatus includes an impedance module; and an input interface electrically connected to the impedance module and to the contact switch of the electrical apparatus. The input interface is configured to have one of a plurality of input impedances, the plurality of input impedances include at least a first input impedance and a second input impedance that is lower than the first input impedance, and the input interface has the second input impedance when the contact switch of the electrical apparatus is open. The input apparatus may include a plurality of leakage current detection modules.

15 Claims, 8 Drawing Sheets

(51) Int. Cl.
*H02B 1/24* (2006.01)
*H02H 1/00* (2006.01)
*H01H 33/02* (2006.01)
*H01H 33/00* (2006.01)
*H02H 7/26* (2006.01)

(52) U.S. Cl.
CPC ............ *H01H 33/027* (2013.01); *H02B 1/24* (2013.01); *H02H 1/0007* (2013.01); *H02H 7/26* (2013.01)

(56) References Cited

U.S. PATENT DOCUMENTS

| | | | |
|---|---|---|---|
| 10,579,085 B2 * | 3/2020 | Chan | G05B 23/0275 |
| 2005/0225909 A1 * | 10/2005 | Yoshizaki | H02H 3/00 361/42 |
| 2013/0229735 A1 | 9/2013 | Rostron | |
| 2017/0294275 A1 | 10/2017 | Spence et al. | |

* cited by examiner

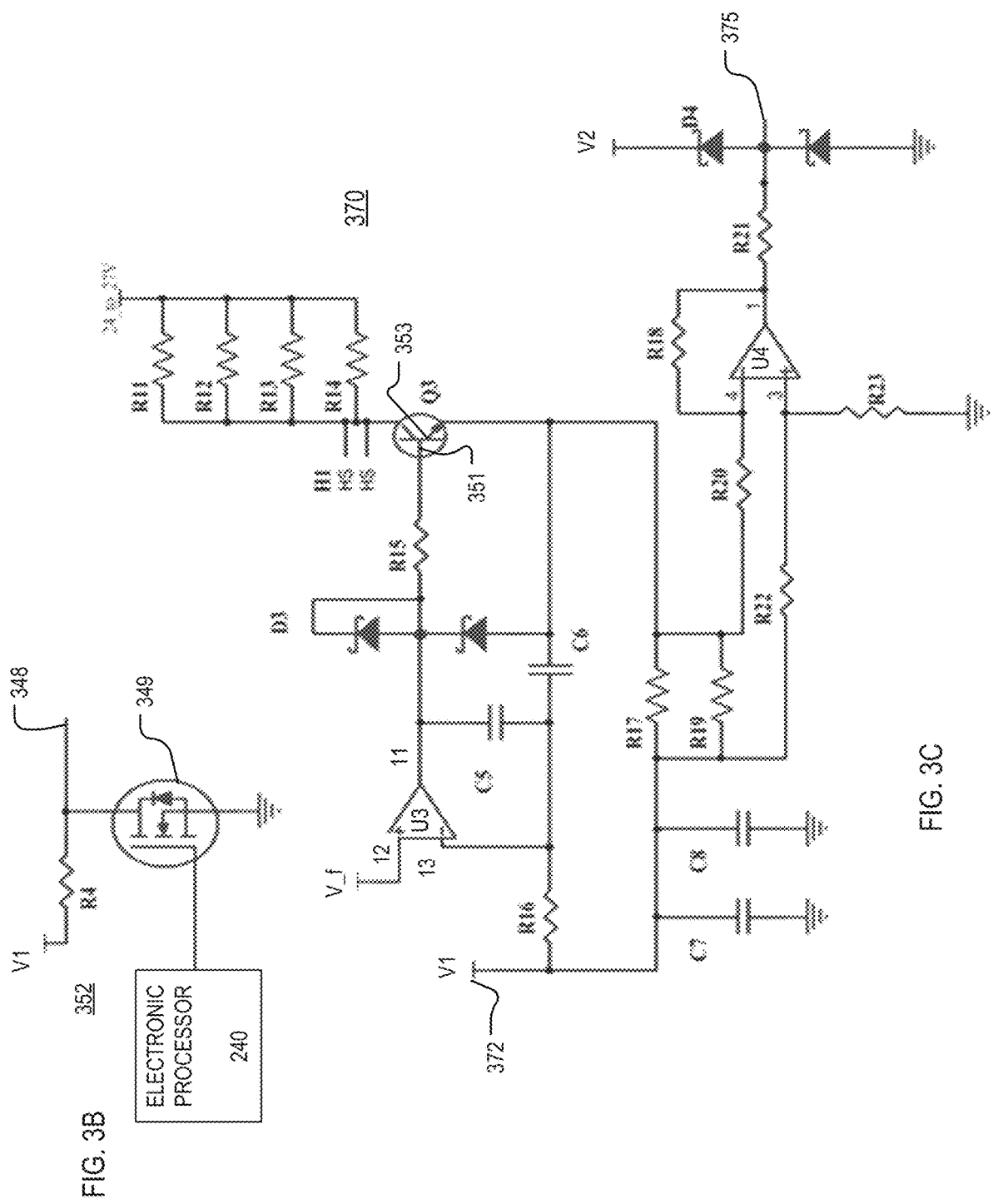

INPUT IMPEDANCE MANAGEMENT AND LEAKAGE CURRENT DETECTION

CROSS-REFERENCE TO RELATED APPLICATION

This application claims the benefit of U.S. Application No. 62/646,001, filed on Mar. 21, 2018 and titled INPUT IMPEDANCE MANAGEMENT AND LEAKAGE CURRENT DETECTION, which is incorporated herein by reference in its entirety.

TECHNICAL FIELD

This disclosure relates to input impedance management and leakage current detection.

BACKGROUND

Switchgear, including reclosers, may be used in an electrical power distribution network to protect the network from electrical fault conditions. Fault conditions are detected by means of the switchgear monitoring currents and voltages on the electrical power distribution network. Fault conditions include transient or steady state amplitude faults as well as frequency or phase is relationship faults. Under normal operating conditions, the recloser is closed, and electrical current flows through the recloser. In response to detecting a fault condition, the recloser trips or opens to prevent current from flowing through the recloser, and then opens and closes a number of times in an attempt to clear the fault. If the fault condition persists, the recloser remains open. If the fault condition clears, the recloser closes and the distribution network resumes normal operation. Voltage regulators may be used to monitor and control a voltage level in the distribution network.

SUMMARY

In one general aspect, a system for an electrical power distribution network includes an electrical apparatus configured to monitor or control one or more aspects of the electrical power distribution network, the electrical apparatus including a contact switch configured to open and close. The system also includes an input apparatus. The input apparatus includes an impedance module; and an input interface electrically connected to the impedance module and to the contact switch of the electrical apparatus. The input interface is configured to have one of a plurality of input impedances, the plurality of input impedances include at least a first input impedance and a second input impedance that is lower than the first input impedance, and the input interface has the second input impedance when the contact switch of the electrical apparatus is open.

Implementations may include one or more of the following features. The input interface may include a first impedance element and the impedance module may include a second impedance element, and, when the contact switch of the electrical apparatus is open, current may flow through the first impedance element and the second impedance element such that the input interface has the second input impedance. The impedance module also may include an electrical switch associated with a first state in which the electrical switch conducts electrical current and a second state in which the electrical switch does not conduct electrical current. In these implementations, current flows in the second impedance element only when the electrical switch is in the first state. The input apparatus also may include an electronic processor configured to provide a signal to the electrical switch, the signal being sufficient to transition the electrical switch to the first state such that the input interface has the second input impedance even if the contact switch of the electrical apparatus is closed. The electronic processor that is coupled to the impedance module may be configured to produce the signal before an expected opening of the contact switch. The electronic processor may be further configured to, after the expected opening of the contact switch, cause the electrical switch to transition to the second state such that the input interface has the first input impedance if the contact switch of the electrical apparatus is closed.

In some implementations, the control cable includes a conductor that electrically connects the input interface and the contact switch. In these implementations, the control system may further include a leakage current detection module electrically coupled to the impedance module, the leakage detection current module being configured to provide an indication of an amount of electrical current that flows in the conductor. The electrical apparatus may include a plurality of contact switches, the control cable may include a plurality of conductors, each of the conductors being connected to one of the plurality of contact switches, the input apparatus may include a plurality of impedance modules and a plurality of input interfaces, each of the input interfaces may be electrically connected to one of the conductors, each of the impedance modules is electrically connected to one of the plurality of input interfaces, and all of the impedance modules may be electrically connected to the leakage current detection module. The electrical apparatus may include a plurality of contact switches, the control cable may include a plurality of conductors, each of the conductors may be connected to one of the plurality of contact switches, the input apparatus may include a plurality of impedance modules and a plurality of input interfaces, each of the input interfaces may be electrically connected to one of the conductors, each of the impedance modules is electrically connected to one of the plurality of input interfaces, the input apparatus may include a plurality of leakage current detection modules, and each of the impedance modules may be electrically connected to one of the leakage current detection modules.

The electrical apparatus may be, for example, a recloser or a voltage regulator.

In another general aspect, an input apparatus includes a plurality of input interfaces, each of the input interfaces configured to electrically connect to a contact switch of an electrical apparatus that monitors or controls one or more aspects of an electrical power distribution network. Each of the input interfaces is configured to have one of a plurality of impedances, the plurality of impedances including at least a first input impedance or a second input impedance, the second input impedance being lower than the first input impedance. The input apparatus also includes a plurality of impedance modules, each impedance module being connected to one of the plurality of input interfaces. Each input interface has the second input impedance when current flows through the impedance module connected to that input interface.

Implementations may include one or more of the following features. The input apparatus also may include one or more leakage current detection modules, with each of the one or more leakage current detection modules being electrically connected to one of the impedance modules, and being configured to measure an amount of electrical current flowing from the one of the impedance modules. The input interface may be configured to receive N conductors, where N is an integer number greater than one, the input apparatus may include N leakage current detection modules, and each of the N leakage current detection modules may be configured to measure a leakage current that flows in one of the N conductors. In some implementations, the input interface is configured to receive N conductors, where N is an integer number greater than one, the input apparatus includes one leakage current detection module, and the leakage current detection module is configured to measure a leakage current that flows in any of the N conductors.

In another general aspect, an amount of leakage current that flows in a cable connecting an electrical apparatus and an input apparatus of a control system is measured; the measured amount of leakage current is analyzed to determine one or more characteristics of the leakage current; whether moisture is present in the cable is determined based on the analysis; and if moisture is determined to be present in the cable, an indication of an error is generated.

Implementations of any of the techniques described herein may include an electrical apparatus and an input apparatus, an input apparatus, an input circuit, an input circuit and a leakage current detection module, a leakage detection module, software stored on a non-transitory computer readable medium that, when executed, monitors and/or analyzes leakage current, a method, and/or a kit for retrofitting a recloser or voltage regulation device. The details of one or more implementations are set forth in the accompanying drawings and the description below. Other features will be apparent from the description and drawings, and from the claims.

DRAWING DESCRIPTION

FIG. 3B is a schematic diagram of an example of trigger module.

FIG. 3C is a schematic diagram of an example of a leakage current detection module.

DETAILED DESCRIPTION

Figure 1A:
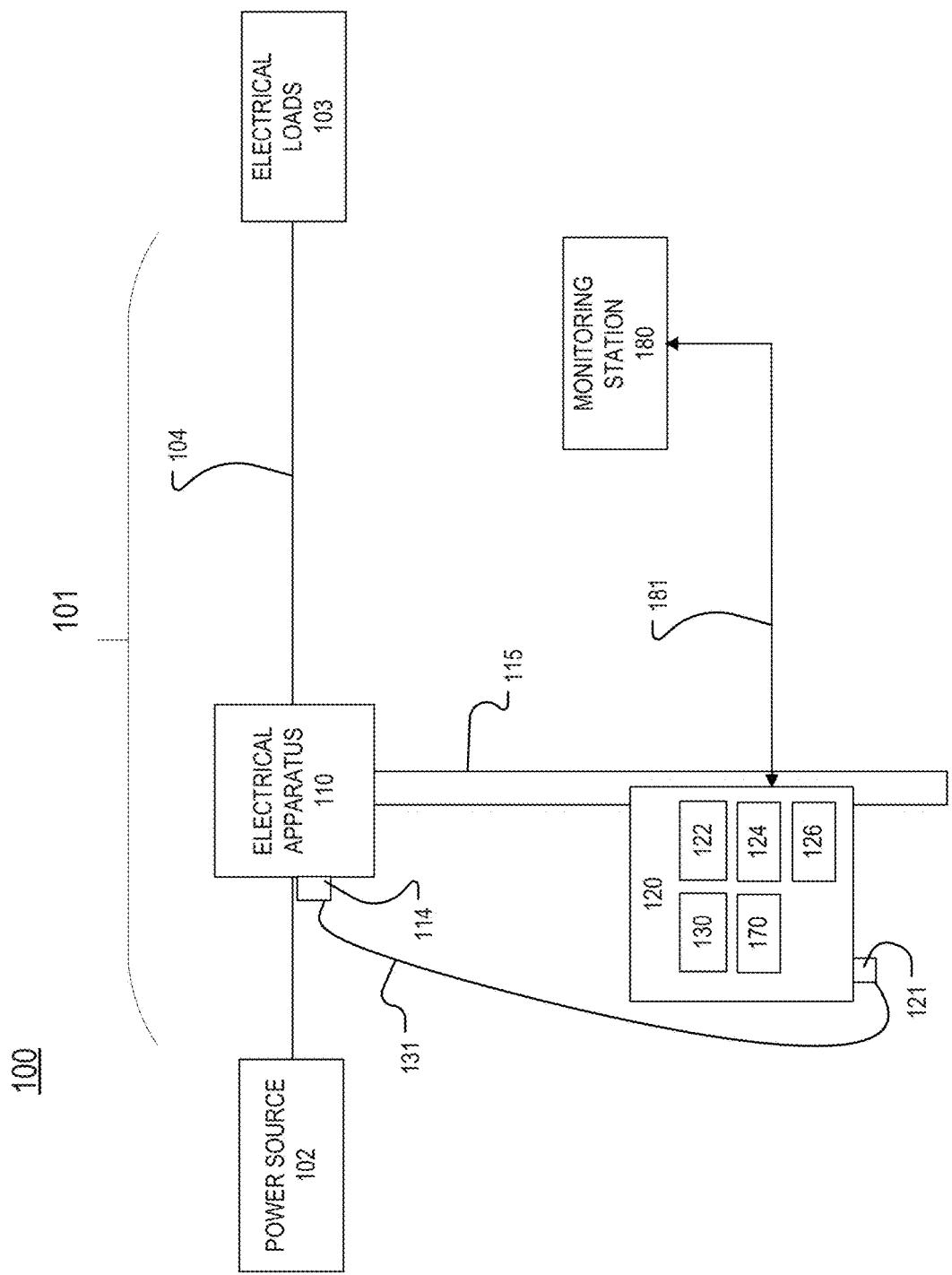
FIGS. 1A and 1B are block diagrams of an example of an electrical power system.

FIG. 1A is a block diagram of an example of an electrical power system 100. The electrical power system 100 includes an electrical power distribution network 101 that transfers electricity from a power source 102 to electrical loads 103 through a distribution path 104 and an electrical apparatus 110. The electrical apparatus 110 is a switchgear, such as a recloser or a voltage regulator, or any other device that is capable of controlling and/or monitoring the flow of electricity on the distribution path 104. The electrical power distribution network 101 may be, for example, an electrical grid, an electrical system, or a multi-phase electrical network that provides electricity to commercial and/or residential customers. The electrical power distribution network 101 may have an operating voltage of, for example, at least 1 kilovolt (kV), up to 34.5 kV, up to 38 kV, or 69 kV or higher, and may operate at a fundamental frequency of, for example, 50-60 Hertz (Hz). The distribution path 104 may include, for example, one or more transmission lines, electrical cables, and/or any other mechanism for transmitting electricity.

The electrical apparatus 110 is mounted to a structure 115. The structure 115 may be, for example, a telephone pole, a substation mounting frame, or other large structure used to support electrical equipment. The electrical apparatus 110 is electrically connected to a control system 120 via a cable 131. The control system 120 monitors the status of the electrical apparatus 110 and controls the electrical apparatus 110. The cable 131 connects to the electrical apparatus 110 at a receptacle 114, and the cable 131 connects to the control system 120 at a receptacle 121. The receptacles 114 and 121 are any type of electrical interface capable of holding the cable 131 and electrically connecting a conductor or conductors in the cable 131 to the electrical apparatus 110 and the control system 120. The control system 120 is also mounted to the structure 115, but is separated from the electrical apparatus 110. The cable 131 is relatively long, for example, 20 to 100 feet (6.10 to 30.84 meters) long, or more than 240 feet (73.15 meters) long.

The control system 120 includes an input apparatus 130 and a leakage current detection module 170. The control system 120 also includes one or more electronic processors 122, an electronic storage 124, and an input/output (I/O) interface 126. The length of the cable 131 may give rise to noise that impacts the ability to monitor the status of the electrical apparatus 110. As discussed below, the input impedance of the input apparatus 130 is controllable, and this allows the control system 120 to reduce or eliminate spurious readings of the status of the electrical apparatus 110.

Moreover, the leakage current detection module 170 meters or measures electrical current in the cable 131. Moisture that enters the cable 131 may cause leakage current between ground and a pin in the receptacle 121 and/or 114, between pins within the receptacle 121, or between pins within the receptacle 114. The presence of moisture may lead to suboptimal performance or failure of the electrical apparatus 110, the cable 131, and/or the control system 120. The control system 120 and/or a monitoring station 180 that communicates with the control system 120 via a data link 181 coupled to the I/O interface 126 uses the measured amount of leakage current from the leakage current detection module 170 to determine whether moisture is present.

When it is determined that moisture is present, the control system 120 may issue an alarm to alert an operator to perform maintenance and/or replace the cable 131, the control system 120, and/or the electrical apparatus 110. Thus, the control system 120 with the input apparatus 130 and the leakage current detection module 170 enables monitoring and early detection of moisture ingress. This monitoring and early detection may reduce the failure rate of the electrical apparatus 110, thereby improving the performance of the electrical power distribution network 101. Furthermore, the capability of the leakage current detection module 170 may be further expanded to current measurements of the coils of a recloser during operation. These current measurements may then be used for determining the health of the electrical apparatus 110 and/or the control system 120. Moreover, the data from the current measurements may be used for diagnostic information and predictive analytics.

Figure 1B:
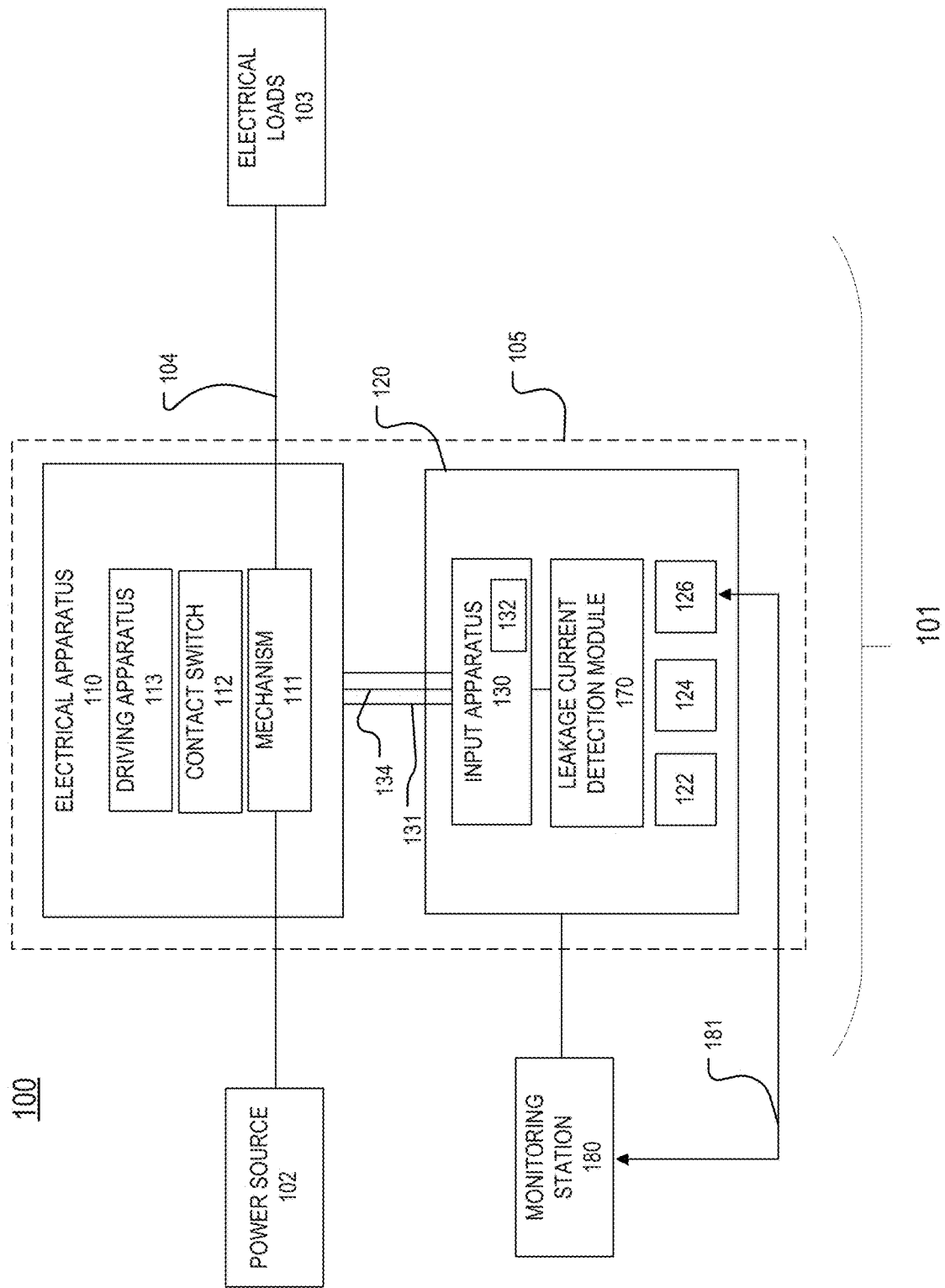

Referring also to FIG. 1B, which is also a block diagram of the electrical power system 100, the electrical apparatus 110 is discussed in greater detail. In the example of FIG. 1B, the electrical apparatus 110 and the control system 120 are part of a system 105. The electrical apparatus 110 includes a mechanism 111, which controls whether and/or how electricity flows through the electrical apparatus 110 (and thus the distribution path 104), and a contact switch 112, which monitors the status of the mechanism 111. The contact switch 112 is also referred to as a status contact 112. The electrical apparatus 110 may include more than one contact switch 112. The contact switches 112 have more than one state, and the state of the contact switches 112 provides the status of the mechanism 111. For example, the contact switches 112 are open when the mechanism 111 is open, and the contact switches 112 are closed when the mechanism 111 is closed. The contact switches 112 may be mechanical contacts or a solid state switch, such as, for example, an open drain metal-oxide-semiconductor field effect transistor (MOSFET) output or open collector transistor output that provides an indication of the status of the mechanism 111. The electrical apparatus 110 also includes a driving apparatus 113 that controls the mechanism 111 by, for example, causing all or part of the mechanism 111 to move such that the electrical apparatus 110 performs an operation. The driving apparatus 113 includes various electrical, mechanical, and/or electro-mechanical devices (such as, for example, coils and/or motors) that control the mechanism 111.

The electrical apparatus 110 is any device or apparatus that may be used to monitor and/or control the electrical power distribution network 101. For example, the electrical apparatus 110 may be any apparatus, device, or system capable of controlling and/or monitoring one or more aspects of electricity that flows in the distribution path 104. The electrical apparatus 110 may be a recloser that controls a flow of electricity in the distribution path 104 by opening (disconnecting) and closing (connecting) contacts that are part of the mechanism 111, with the status of the contacts (opened or closed) being monitored by one or more contact switches 112. During ordinary operating conditions, the mechanism 111 of a recloser is closed such that electricity flows through the recloser and in the distribution path 104. The mechanism 111 opens during anomalous events, such as lightning strikes, to stop the flow of electricity in the distribution path 104. The electrical apparatus 110 may be a voltage regulator that controls a voltage at the distribution path 104. In these implementations, the mechanism 111 may be, for example, a tap changer, and the position of the tap determines the voltage output by the voltage regulator, with the contact switch 112 providing the status of the tap.

The cable 131 houses a conductor 134 for each of the contact switches 112, with each conductor 134 electrically connecting the contact switch 112 to the input apparatus 130. For simplicity, only one conductor 134 is shown in FIG. 1B. As discussed above, the cable 131 is relatively long, for example, 20 to 100 feet (6.10 to 30.84 meters) long, or more than 100 feet (30.84 meters) long. The length of the cable 131 may give rise to noise that impacts the ability to monitor the status of the contact switch 112.

The input apparatus 130 includes one or more input circuits 132 that are configured to have an input impedance that depends on the state of the contact switch 112. For example, the input circuit 132 may have a relatively low input impedance when the contact switch 112 is open and a relatively high input impedance when the contact switch 112 is closed. By having a low input impedance when the contact switch 112 is open, the input circuit 132 provides greater noise immunity than the input circuit 132 that has a high impedance when the contact switch 112 is open. As a result, a status from the input apparatus 130 that indicates that the contact switch 112 is open may be more accurate than a status from a system that has a high input impedance when the contact switch 112 is open. Moreover, the input circuit 132 provides a high input impedance when the contact switch 112 is closed, resulting in reduced power consumption during typical operation when the contact switch 112 is closed. As such, the input apparatus 130 provides the benefits of a low input impedance when the contact switch 112 is open while providing a high input impedance at other times.

FIGS. 2, 3A, 5, and 6 show examples of implementations of the input circuit 132. FIG. 3C shows an example of a leakage current detection module 170. FIG. 4 is a flow chart of a process for metering and/or analyzing leakage current.

Figure 2:
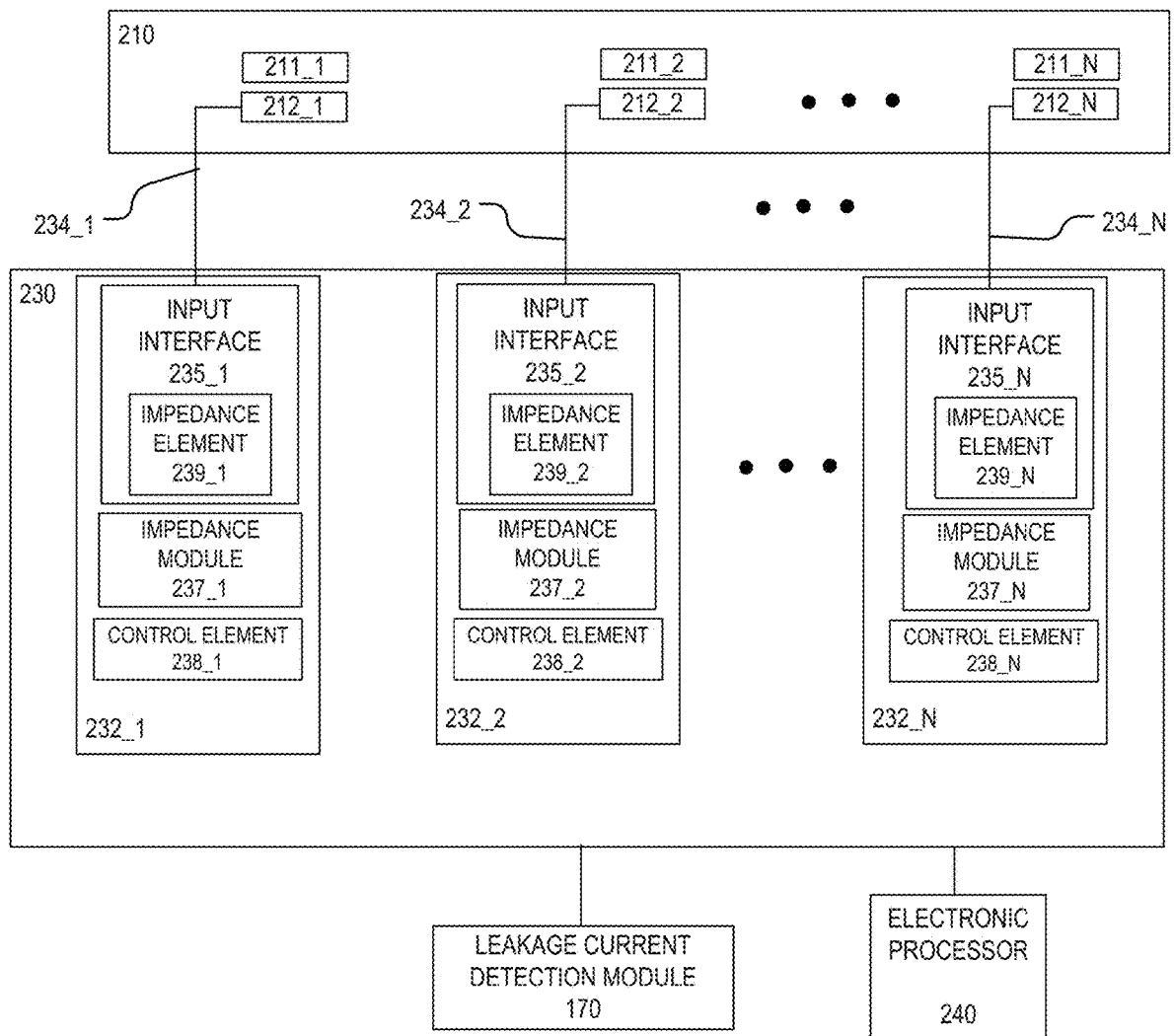
FIG. 2 is a block diagram of an example of an input apparatus.

Referring to FIG. 2, a block diagram of an input apparatus 230 is shown. The input apparatus 230 is an example of an implementation of the input apparatus 130 (FIGS. 1A and 1B). The input apparatus 230 includes N input circuits 232_1, 232_2, . . . , 232_N, where N is an integer number of one (1) or greater. Each input circuit 232_1, 232_2, . . . , 232_N is configured to have one of a plurality of different input impedances. In the example of FIG. 2, each of the input circuits 232_1, 232_2, . . . , 232_N is configured to have either a first input impedance or a second input impedance. The first and second input impedances are different impedances, with the second input impedance being a smaller impedance than the first input impedance.

Each of the N input circuits 232_1, 232_2, . . . , 232_N includes a respective input interface 235_1, 235_2, . . . , 235_N. Each input interface 235_1, 235_2, . . . , 235_N is electrically connected to a respective contact switch 212_1, 212_2, . . . , 212_N via an electrical conductor 234_1, 234_2, . . . , 234_N. The contact switches 212_1, 212_2, . . . , 212_N are part of an electrical apparatus 210. The electrical conductors 234_1, 234_2, . . . , 234_N may be contained in a single cable (not shown) that is connected to the input apparatus 230 and the electrical apparatus 210.

All of the input circuits 232_1, 232_2, . . . , 232_N are configured and function in the same manner. For simplicity, only the input circuit 232_1 is discussed in detail.

Figure 6:
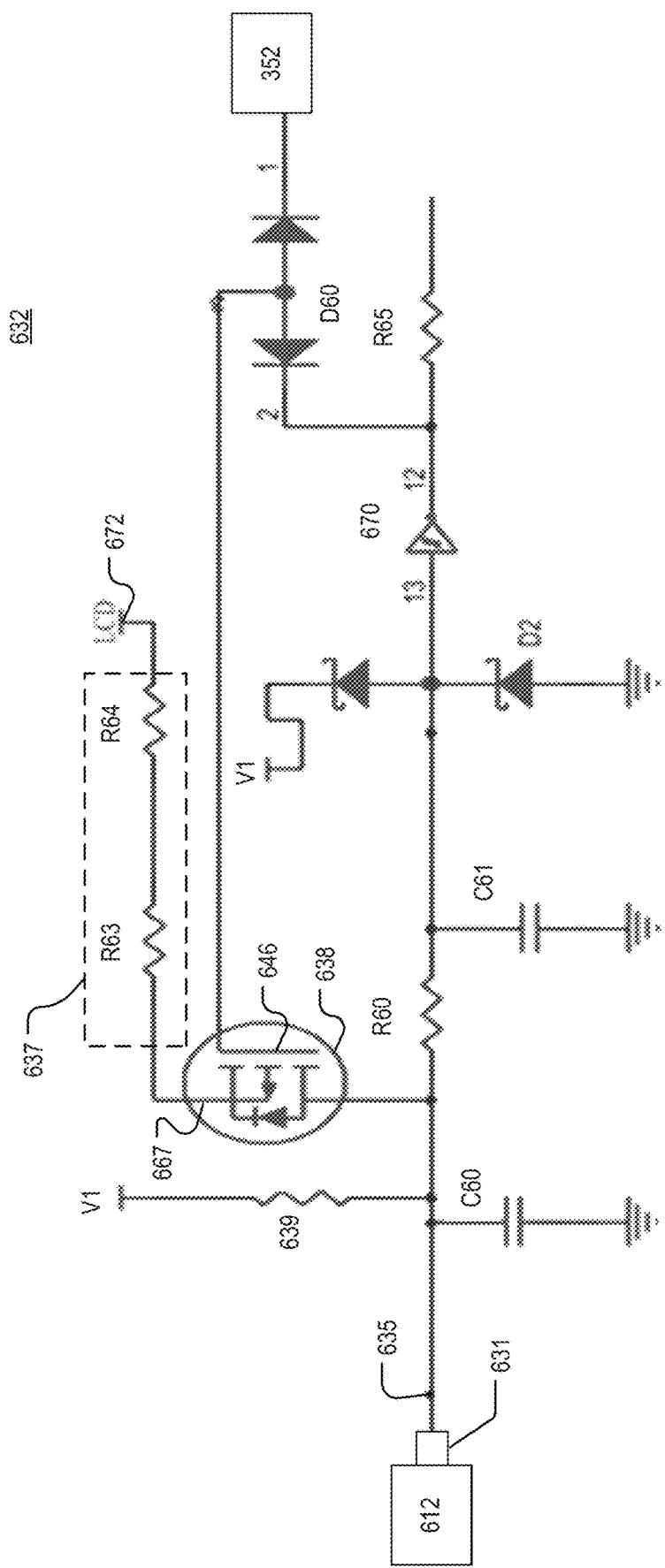
FIG. 6 is a schematic diagram of another example of an input circuit.

The input circuit 232_1 includes an input interface 235_1 and an impedance module 237_1. The input interface 235_1 is electrically connected to the contact switch 212_1 via the conductor 234_1. The input interface 235_1 includes an impedance element 239_1. The impedance element 239_1 may be, for example, a collection of any type of electronic elements that have resistance. For example, the impedance element 239_1 may include resistors arranged in series and/or parallel. The impedance module 237_1 also includes any type of electronic elements that have resistance. The impedance module 237_1 may include resistors in any configuration and/or a current source. FIG. 6 shows an example of an impedance module that includes a current source.

The input circuit 232_1 is configured such that current is not always able to flow through the impedance module 237_1. When current is not able to flow through the impedance module 237_1, the input impedance of the input circuit 232_1 is the same as the impedance of the impedance element 239_1. When current is able to flow through the impedance module 237_1, the impedance module 237_1 and the impedance element 239_1 are in parallel with each other, and the impedance of the input circuit 232_1 is the parallel combination of the impedance module 237_1 and the impedance element 239_1. Equation 1 provides the relationship between the impedance values of the impedance module 237_1 and the impedance element 239_1 and the parallel combination of the components:

$$Ztotal = \frac{(Z1)(Z2)}{Z1 + Z2},\qquad \text{Equation (1)}$$

where Z1 is the impedance of the impedance element 239_1 and Z2 is the impedance of the impedance module 237_1. The parallel combination (Ztotal) is less than the impedance of the impedance element 239_1 and less than the impedance of the impedance module 237_1. As such, when current is able to flow through the impedance module 237_1, the input circuit 232_1 has a lower input impedance than when current is not able to flow through the impedance module 237_1.

Thus, the input circuit 232_1 has two possible input impedances, a first input impedance that is the impedance of the impedance element 239_1, and a second input impedance that is the impedance of the impedance element 239_1 in parallel with the impedance module 237_1. The second input impedance is a lower impedance than the first input impedance.

When the contact switch 212_1 is open, current is able to flow in the impedance module 237_1. Thus, the input circuit 232_1 has the second input impedance (the lower input impedance) when the contact switch 212_1 is open. For example, the impedance module 237_1 may be connected to a control element 238_1 (such as the transistor 338 of FIG. 3A or another type of switch) The state of the control element 238_1 determines whether or not current is able to flow in the impedance module 237_1. In some implementations, the input circuit 232_1 may be configured such that, when the control element 238_1 is in an ON state, current is able to flow in the impedance module 237_1, and when the transistor is in an OFF state, current is not able to flow in the impedance module 237_1. In these implementations, opening the contact switch 212_1 causes the control element 238_1 to transition to a state in which current is able to flow in the impedance module 237_1.

Additionally, the impedance module 237_1 may be configured to conduct current based on a trigger or command from an electronic processor 240. The electronic processor 240 may be any type of electronic processor and may or may not include a general purpose central processing unit (CPU), a graphics processing unit (GPU), a microcontroller, a field-programmable gate array (FPGA), Complex Programmable Logic Device (CPLD), and/or an application-specific integrated circuit (ASIC). The electronic processor 240 may perform other actions in addition to generating the trigger for the impedance module 237_1. For example, the electronic processor 240 may be used with or instead of the electronic processor 122 of the control system 120 and may generate command signals that cause the contact switch 212_1 to open or close or cause a mechanism 211_1 of the electrical apparatus 210 to operate.

The trigger from the electronic processor 240 is sufficient to cause the control element 238_1 to transition to a state that allows current to flow in the impedance module 237_1 even if the contact switch 212_1 is closed. For example, the electronic processor 240 may provide the trigger signal to the control element 238_1 just before the contact switch 212_1 is expected to open (or just before the mechanism 211_1 operates) to ensure that the input circuit 232_1 has the second input impedance (the lower input impedance) when the contact switch 212_1 opens (or when the mechanism 211_1 operates). Additionally, the electronic processor 240 may provide a trigger signal sufficient to cause the control element 238_1 to transition to a state that prevents current from flowing in the impedance module 237_1 such that the input circuit 232_1 has the first input impedance (the higher input impedance).

Each of the other input circuits 232_2 to 232_N are configured and function in the same manner as the input circuit 232_1. In particular, each of the input circuits 232_2 to 232_N includes a respective input interface 235_2 to 235_N and a respective impedance module 237_2 to 237_N. Each of the input interfaces 235_2 to 235_N include a respective impedance element 239_2 to 239_N. Each of the input interfaces 235_2 to 235_N is electrically connected to a respective contact switch 212_2 to 212_N. When any of the contact switches 212_2 to 212_N are open, current is able to flow through the respective impedance module 237_2 to 237_N, lowering the input impedance of the respective input interface 235_2 to 235_N. Additionally, the electronic processor 240 is configured to provide a trigger signal to any of the impedance modules 237_2 to 237_N to cause the respective input circuit 232_2 to 232_N to have a lower input impedance regardless of whether the respective contact switch 212_2 to 212_N is open or closed.

The impedance modules 237_1, 237_2, . . . , 237_N are electrically connected to the leakage current detection module 170. Leakage current may form in the conductors 234_1, 232_4, . . . , 234_N and flow through the impedance modules 237_1, 237_2, . . . , 237_N when the respective switch 212_1, 212_2, . . . , 212_N is open. The leakage current is measured by the leakage current detection module 170. FIG. 3C provides an example of an implementation of the leakage current detection module 170.

In the example of FIG. 2, all of the impedance modules 237_1, 237_2, . . . , 237_N are connected to the leakage current detection module 170. Thus, the leakage current measured at the leakage current detection module 170 is the sum of all leakage current in the conductors 234_1, 234_2, . . . , 234_N that are connected to an open contact switch. Other implementations are possible. For example, an instance of the leakage current detection module 170 may be electrically connected to each of the impedance modules 237_1, 237_2, . . . 237_N such that the is leakage current may be measured on each of the conductors 234_1, 234_2, . . . , 234_N.

Moreover, the input apparatus 230 may be connected to more than one electrical apparatus 210. In the example shown in FIG. 2, each of the contact switches 212_1, 212_2, . . . 212_N are part of the same electrical apparatus 210. In other implementations, at least some of the contact switches 212_1, 212_2, . . . , 212_N are part of one or more electrical apparatuses that are separate and distinct from the electrical apparatus 210, with some of the input interfaces 235_1, 235_2, . . . , 235_N being connected to the electrical apparatus 210 and others being connected to the separate and distinct electrical apparatuses. Thus, the input apparatus 230 may monitor leakage current from different electrical apparatuses and may provide input impedance management to more than one electrical apparatus 210.

Figure 3A:
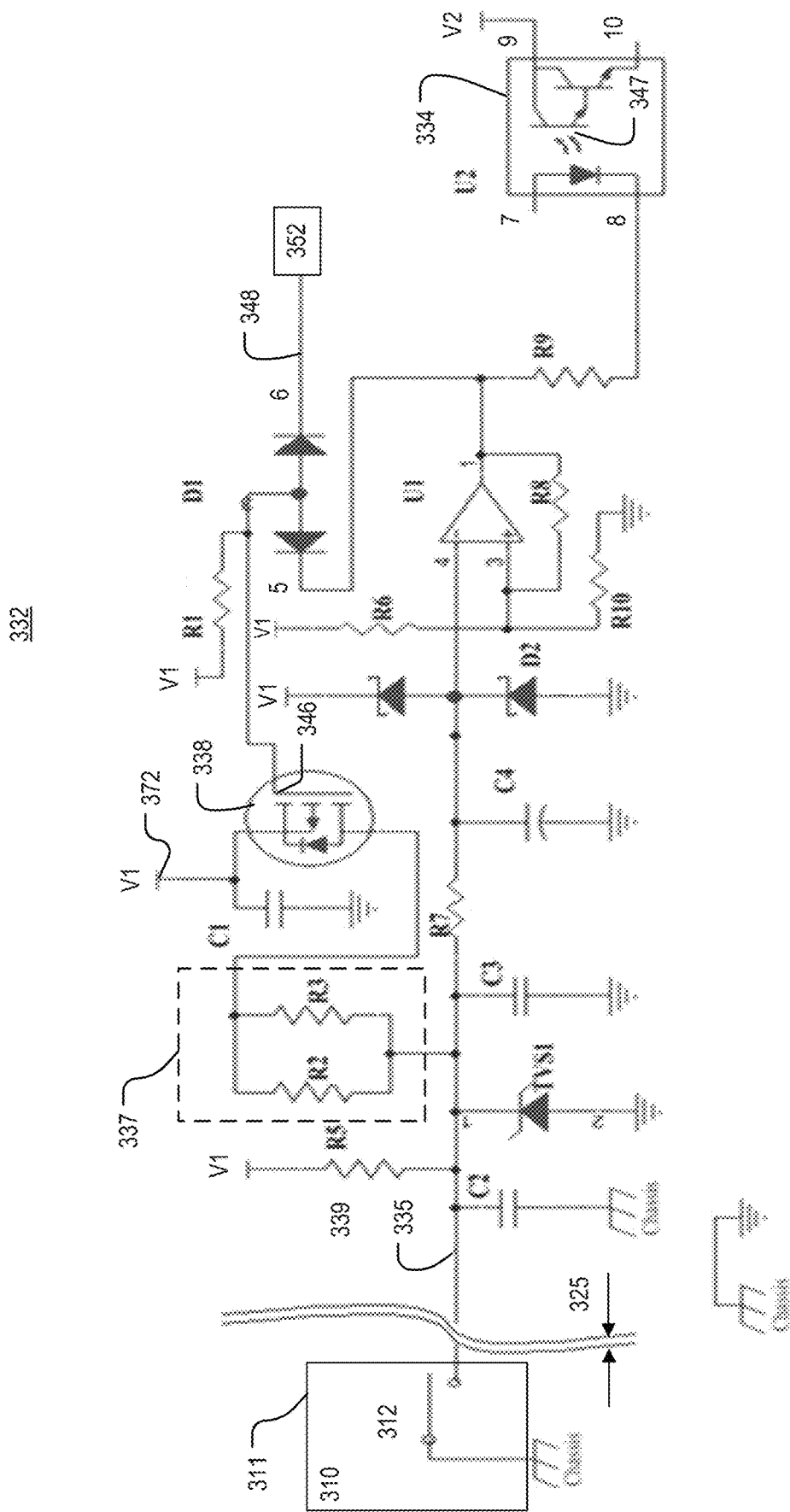
FIG. 3A is a schematic diagram of an example of an input circuit.
Figure 4:
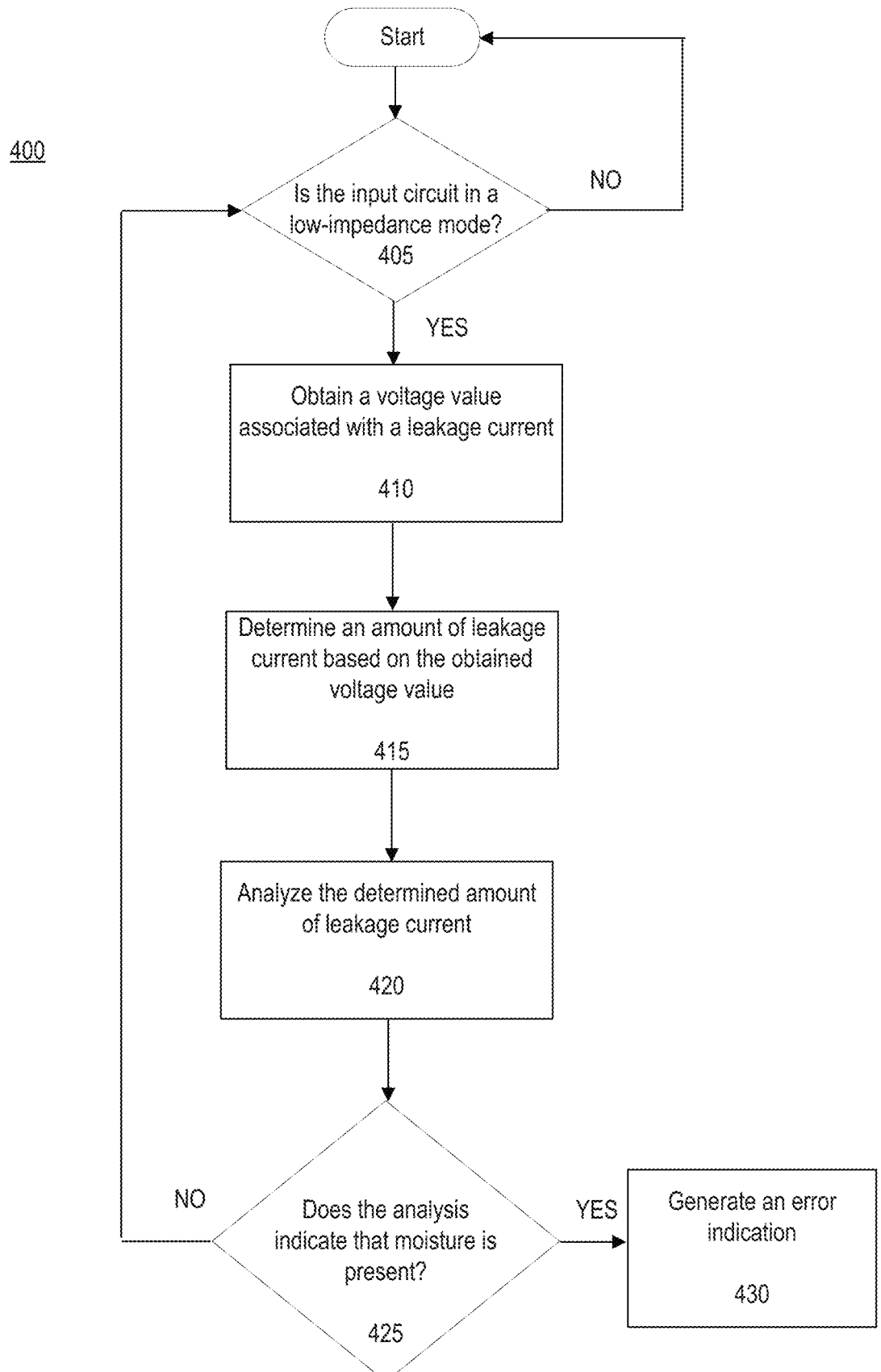
FIG. 4 is a flow chart of an example of a process for metering leakage current.

FIG. 3A is a schematic diagram of an input circuit 332. The input circuit 332 may be used as any or all of the input circuits 232_1, 232_2, . . . , 232_N. The input circuit 332 includes an input interface 335 that is electrically connected to a contact switch 312 through a cable such as the cable 131 of FIGS. 1A and 1B. The cable is not shown in FIG. 3A. The length of the cable (which may be at least 20 feet) is represented as the break 325 in FIG. 3A. The contact switch 312 is illustrated in the open position in FIG. 3A. The contact switch 312 is part of an electrical apparatus 310, which may be, for example, a recloser or a voltage regulator. The electrical apparatus 310 includes a housing, chassis, or other support frame 311. The housing 311 is grounded. The input circuit 332 provides a low input impedance when the contact switch 312 is open and a high input impedance when the contact switch 312 is closed. Thus, the input circuit 332 is a dual input impedance input circuit. The input circuit 332 is self-powered, meaning that the state of the contact switch 312 (open or closed) is detected by the input circuit 332 without using an external power source.

When the contact switch 312 opens, an impedance element 339 pulls the input interface 335 up to V1. Current flows through a resistor R7 to a capacitor C4, which charges to V1. V1 may be, for example, 15 volts (V). In the example of FIG. 3A, the impedance element 339 is a resistor R5. The resistor R5 may have an impedance of, for example, 1.5 kilo Ohms (kΩ). The resistor R5 is illustrated as a single resistor, but any combination or arrangement of electronic components may be used to form the resistor R5.

The input circuit 332 also includes a comparator U1. In the example of FIG. 3A, the comparator U1 is an operational amplifier. However, the comparator U1 may be any collection or arrangement of electronic elements that is capable of comparing more than one voltage at an input and producing an output that indicates the relative difference among the voltages. For example, the comparator U1 may be any configuration of electronic elements that compares two voltages at the input and produces a binary output (for example, high or low) that indicates which of the two input voltages is greater.

The positive input of the comparator U1 is labeled as pin 3, the negative input of the comparator U1 is labeled as pin 4, and the output of the comparator U1 is labeled as pin 1. A resistor network that includes resistors R6, R8, and R10 forms a voltage divider that biases the positive input of the comparator U1. When the voltage at the negative input of the comparator U1 is less than the voltage at the positive input of the comparator U1, the output of the comparator U1 is high. When the voltage at the negative input of the comparator U1 is more than the voltage at the positive input of the comparator U1, the output of the comparator U1 is low.

The state of the output of the comparator U1 impacts the overall resistance of the voltage divider formed by resistors R6, R8, and R10. When the output of the comparator U1 is low, the voltage divider formed by resistors R6, R8, and R10 has a lower overall impedance than when the output of the comparator U1 is high. The bias voltage at the positive input of the comparator U1 is thus greater than when the output of the comparator U1 is high. For example, in implementations in which the resistor R6 is 100 kΩ, the resistor R8 is 205 kΩ, the resistor R10 is 49.9 kΩ, and V1 is 15 V, the bias voltage at the positive input is 6.39 V when the output of the comparator U1 is high and 4.30 V when the output of the comparator U1 is low. The values of the resistors R6, R8, and R10 (and V1) may be selected to control the voltage at which the output of the comparator U1 changes state.

The voltage V1 is selected such that V1 is greater than the bias voltage at the positive input of the comparator U1. Thus, after the capacitor C4 charges to V1, the voltage at the negative input of the comparator U1 is higher than the voltage at positive input of the comparator U1. Thus, the output of the comparator U1 is low. The low output of the comparator U1 forward biases a diode D1 (shown at pin 5). The diode D1 transitions a control element 338 to a state that conducts current. In the example of FIG. 3, the control element 338 is a P-channel metal-oxide-semiconductor field effect transistor (MOSFET) that transitions to an ON state and conducts current when a gate node 346 is pulled low. The gate node 346 is pulled low by the low output of the comparator U1 through the diode D1.

When the control element 338 is ON, current is able to flow in the control element 338 and in an impedance module 337 that is connected to the drain of the control element 338, pulling the impedance module 337 to V1. By pulling the impedance module 337 to V1, the impedance module 337 is placed in parallel with the impedance element 339. As such, when the control element 338 is ON, the input impedance of the input circuit 332 is the parallel combination of the impedance module 337 and the impedance element 339. In the example of FIG. 3A, the impedance module 337 includes a resistor R2 and a resistor R3, which is in parallel with the resistor R2. The resistors R2 and R3 may each be, for example, 430Ω. Thus, the parallel combination of the impedance module 337 and the impedance element 339 may be about 188Ω, which is less than the impedance of the impedance element 339 and less than the impedance of the impedance module 337.

Accordingly, the input impedance of the input circuit 332 becomes the lower of the two possible input impedances in response to the contact switch 312 opening. While the contact switch 312 is open, the capacitor C4 remains charged to V1, causing the output of the comparator U1 to remain low such that the control element 338 remains ON. Thus, the input impedance of the input circuit 332 remains low while the contact switch 312 is open.

The input circuit 332 includes other components. For example, the input circuit 332 also includes an optocoupler U2. When the output of the comparator U1 is low, current flows through the optocoupler U2 and turns ON a transistor 347. An optocoupler is an electronic component or circuit assembly that transfers electrical signals between two isolated circuits by using light. In the example of FIG. 3A, the optocoupler U2 isolates a digital ground of the input circuit 332 from the ground.

Moreover, the input circuit 332 may provide an indication that the contact switch 312 is open. For example, the output of the comparator U1 or the optocoupler U2 may be used to provide a perceivable indication of the status of the contact switch 312. The perceivable and/or measurable signal may be, for example, a voltage across a resistive network connected to pin 10 of the transistor 347, or light emitted from a light-emitting diode connected to pin 10 of the transistor 347.

Referring also to FIG. 3B, a trigger module 352 is connected to the diode D1 at pin 6 (labeled as node 348 in FIGS. 3A and 3B). The trigger module 352 is used to force the input circuit 332 to have the lower input impedance by turning ON the control element 338. The trigger module includes a control element 349 that is electrically connected to the electronic processor 240. The electronic processor 240 controls the state of the control element 349. The trigger module 352 may be connected to more than one instance of the input circuit 332.

During steady-state operation of the electrical apparatus 310, the contact switch 312 is closed. The electronic processor 240 prepares to operate the electrical apparatus 310 that contains the contact switch 312. In other words, the electronic processor 240 prepares to generate a command signal that, when provided to the electrical apparatus 310, will cause the contact switch 312 to open. In anticipation of opening the contact switch 312, the electronic processor 240 forces the input impedance of the input circuit 332 to be low to minimize the influence of noise on the conductors that electrically connect the input interface 335 to the contact switch 312.

To force the input impedance of the input circuit 332 to be low prior to the contact switch 312 opening, the electronic processor 240 triggers the control element 349 ON. For example, the control element 349 may be an N-channel MOSFET, and the electronic processor 240 may cause a voltage sufficient to turn on the control element 349 to be provided to the gate of the MOSFET. The electronic processor 240 turns on the control element 349, and the control element 349 causes the diode D1 at node 348 to be forward biased, thereby forcing the control element 338 to be ON. Thus, current is able to flow through the impedance module 337, causing the input impedance of the input circuit 332 to be low.

After the operation is complete (for example, after the electrical apparatus 310 has operated and the contact switch 312 is opened), the electronic processor 240 turns off the control element 349. As noted above, the electronic processor 240 and the control element 349 may be electrically connected to more than one instance of the input circuit 332. Each instance of the input circuit 332 is electrically connected to at least one contact switch. Although the electronic processor 240 commands the electrical apparatus 310 to operate such that the contact switch 312 opens, some of the other contact switches in the electrical apparatus 310 may remain closed. In implementations in which all of the instances of the input circuit 332 are connected to the control element 349, all of the input circuits 332 have the lower impedance when the control element 349 is ON regardless of the state of the contact switch connected to the input circuit.

After the electronic processor 240 turns the control element 349 OFF, input circuits that are connected to a contact switch that is open continue to have the low input impedance because current continues to flow through the impedance module 337. In particular, when the contact switch 312 is open, the output of the comparator U1 is low regardless of the state of the control element 349. The low output of the comparator U1 forward biases the diode D1 at pin 5 and causes the control element 238 to remain ON such that current flows through the impedance module 337. Additionally, the output of the comparator U1 being low causes the output of the transistor 347 to produce the indication of an open contact switch.

When the control element 349 is OFF, input circuits that are connected to a contact switch that is closed have the higher input impedance. Returning to the example of FIG. 3A, when the contact switch 312 closes, current (for example, about 70 milliamps) flows through the contact switch 312. The resistor R7 discharges the capacitor C4 from V1 to zero (0) V. The negative input of the comparator U1 (pin 4 in the example of FIG. 3A) falls below the positive input of the comparator U1 (pin 3), which causes the output of the comparator U1 to become high. When the output of the comparator U1 is high, the optocoupler U2 and the diode D1 at pin 5 are OFF. If the control element 349 (FIG. 3B) is OFF or is turned OFF by the electronic processor 240, the resistor R1 pulls the gate node of the control element 338 up to V1, which causes the control element 338 to turn OFF. Thus, current is not able to flow through the impedance module 337 and current only flows through the impedance element 339. As a result, the input impedance of the input circuit 332 is the impedance of the impedance element 339.

Referring also to FIG. 3C, a schematic of a leakage current detection module 370 is shown. Leakage current may be current that flows in an input wire (such as a wire at the input interface 335) to ground. Leakage current is spurious current that is not intended to be in the cable that connects the input circuit 332 to the electrical apparatus 310. The presence of leakage current may be an indication of an existing or a potential problem with the cable and/or the electrical apparatus 310. For example, leakage current may be present when moisture is in the cable.

The leakage current detection module 370 is an example of an implementation of the leakage current detection module 170 (FIGS. 1 and 2). The leakage current detection module 370 is electrically connected to the input circuit 332 at a leakage current detection (LCD) node 372. In the input circuit 332 shown in the example of FIG. 3A, the node 372 corresponds to the source of the P-channel MOSFET 338. Although only one input circuit 332 is shown in FIG. 3A, more than one input circuit 332 may be used. In implementations in which more than one input circuit 332 is used, the leakage current detection module 370 may be electrically connected to the LCD node 372 (the source of the P-channel MOSFET 338) of each input circuit 332. In other words, a single leakage current detection module 370 may be electrically connected to more than one instance of the input circuit 332. Other implementations are possible. For example, in some implementations that include more than one input circuit 332, each input circuit 332 is electrically connected to a separate leakage current detection module 370.

Referring to the example shown in FIGS. 3A and 3C, when the contact switch 312 is open, the control element 338 conducts current. If leakage current is present, the leakage current flows through the impedance module 337, through the LCD node 372, and into the leakage current detection module 370. The leakage current is measured at an output node 375 of the leakage current detection module 370.

The leakage current detection module 370 includes an electrical amplifier U3. In the example of FIG. 3C, the electrical amplifier U3 is an operational amplifier. However, the electrical amplifier U3 may be any electronic component or collection of electronic components that is associated with a gain and is configured to amplify an input signal by the gain to produce an amplified output signal. The electrical amplifier U3 may be an analog electronic component that produces an amplified analog electrical output signal based on an analog electrical input signal.

The electrical amplifier U3 has an output at pin 11, a positive input at pin 12, and a negative input at pin 13. The negative input of the electrical amplifier U3 is connected to the LCD node 372 through a resistor R16 such that a leakage current detect voltage is sensed at the negative input of the electrical amplifier U3. The output of the electrical amplifier U3 is connected to a base 351 of a transistor Q3, which is an NPN bipolar junction power transistor (BJT) in the example of FIG. 3C. The positive input of the electrical amplifier U3 is connected to V1 (for example, 15 V). The voltage of V1 is regulated by the electrical amplifier U3 and the transistor Q3. The electrical amplifier U3 senses the V1 voltage at the left side of R16 and provides the bias to the transistor Q3 such that Q3 operates in class-A mode to regulate the V1 voltage at the same voltage level (V_f) as pin 12 of the electrical amplifier U3. The voltage level of pin 12 of the electrical amplifier U3 is labeled as V_f and is +15V in the example of FIG. 3B.

The voltage supplied to the base of the transistor Q3 is sufficient to cause the transistor Q3 to operate in class-A mode. In class-A mode or class-A operation, a signal that is input to the base of the BJT is entirely reproduced at the emitter of the BJT. In the example of FIG. 3C, the emitter of the transistor Q3 is labeled 353. The leakage current detection module 370 also includes resistors R17 and R19, which are in parallel with each other and electrically connected to the LCD node 372. The parallel combination of the resistors R17 and R19 are also connected to the positive input of an electrical amplifier U4 through resistors R22 and R23. In the example of FIG. 3C, the electrical amplifier U4 is an operational amplifier. However, the electrical amplifier U4 may be any electronic component or collection of electronic components that is associated with a gain and is configured to amplify an input signal by the gain to produce an amplified output signal.

When the contact switch 312 is open, and there exists leakage current from node 335 to the chassis 311 due to moisture in the cable represented by gap 325, current flows out of node 372 through resistors 337 to the chassis 311 of FIG. 3A. This leakage current also flows through resistors R17 and R19 of FIG. 3B from the emitter of Q3. This leakage current causes a voltage drop across R17 and R19 that is sensed by the electrical amplifier U4. The output signal of the electrical amplifier is converted to the appropriate offset and range so that an analog-to-digital (A/D) converter (not shown) can meter the leakage current at node 375.

The current that flows through the resistors R17 and R19 as leakage current is sourced from the LCD node 372. The resistors R20, R18, R22, and R23 are configured such that the output of the electrical amplifier U4 swings between a minimum voltage (0 V) and a maximum voltage (V2) based on the amount of leakage current that flows through the parallel combination of resistors R17 and R19. V2 may be, for example, 5 V. When no or very little current flows through the parallel combination of resistors R17 and R19, the output of the electrical amplifier U4 is at V2. When a relatively large amount of leakage current flows through the parallel combination of resistors R17 and R19, the output of the electrical amplifier U4 is 0V. Thus, the output of the electrical amplifier U4 being 0 V indicates that leakage current is present. In some implementations, the output of the electrical amplifier U4 being 0 V indicates that about 517 milliamps (mA) of leakage current flows from the LCD node 372. When the output of the electrical amplifier U4 is V2, leakage current is not present. Output values between 0 V and V2 indicate that an amount of leakage current greater than 0 A but less than 517 mA is present.

The output of the electrical amplifier U4 may be provided to an analog-to-digital (A/D) converter (not shown) at node 375. The A/D converter produces a digital signal with values that indicate how much leakage current is detected at the output of the electrical amplifier U4. The analog-to-digital converter may be, for example, a 12-bit analog-to-digital converter that produces a digital signal that may have 2048 different values to represent the amount of leakage current detected at the output of the electrical amplifier U4 as a function of time.

The leakage current detection module 370 also includes elements that are not directly involved in detecting leakage current. In the example of FIG. 3C, the leakage current detection module 370 also includes a resistor network that includes resistors R11, R12, R13, and R14 in parallel. The resistor network is used for power dissipation.

Referring to FIG. 4, a flow chart of an example process 400 for metering leakage current is shown. The process 400 may be performed by the electronic processor 122 (FIGS. 1A and 1B) and/or by the monitoring station 180 (FIGS. 1A and 1B). The process 400 may be implemented as instructions, perhaps a computer program, that is stored at the control system 120 and/or at the monitoring station 180 or downloaded onto the control system 120 and/or the monitoring station 180. The process 400 is discussed for an example in which the leakage current detection module 370 (FIG. 3C) is connected to nine instances of the input circuit 332 (FIG. 3A). The leakage current detection module 370 may be connected to more or fewer instances of the input circuit 332.

Each of the nine instances of the input circuit 332 is electrically connected to a contact switch in a three-phase recloser via a cable, such as the cable 131 of FIGS. 1A and 1B. In other words, the electrical apparatus 330 is a three-phase recloser in the example of FIG. 4. The three phases are referred to as Phase A, Phase B, and Phase C. Each phase has three contact switches: Switch 1, Switch 2, and Switch 3. Thus, there are nine contact switches in the electrical apparatus 330. The state of the contact switches (open or closed) for the example of FIG. 4 are shown in Table 1.

| Phase | Switch 1 | Switch 2 | Switch 3 |
| --- | --- | --- | --- |
| A | Closed | Open | Closed |
| B | Closed | Open | Open |
| C | Closed | Open | Closed |

The process 400 begins by determining whether any of the input circuits 332 have the low impedance (405). An input circuit that has the low impedance may be referred to as being in the low impedance mode. The input circuit 332 is in the low impedance mode when current is able to flow through the impedance module 337. The input circuit 332 also is in the low impedance mode when the contact switch connected to the input circuit 332 is open. The input circuit 332 is in the low impedance mode when the output of the comparator U1 is low. Thus, it may be determined that the input circuit 332 is in the low impedance mode by measuring the output of the comparator U1 or by determining whether current flows in the impedance module 337.

In the example of Table 1, four instances of the input circuit 332 are in the low impedance mode. In particular, the input circuits that are electrically connected to the contact switches Switch 2_A, Switch 2_B, Switch 2_C, and Switch 3_B are in the low impedance mode. When determining whether the input circuit 332 is in the low impedance mode, the process 400 also may determine how many input circuits 332 are in the low impedance mode. In the example of FIG. 4, four input circuits 332 are in the low impedance mode.

As discussed above, leakage current from the cable may be detected in conductors that are connected to open contact switches. If none of the contact switches are open, then the leakage current is not detected, and the process 400 continues to determine whether any of the input circuits are in the low impedance mode and waits until a contact switch opens. In the present example, four contact switches are open, and leakage current flows from the four input circuits that are connected to the open contact switches to the LCD node 372. A voltage value associated with the leakage current that flows from the LCD node 372 is obtained (410). For example, the voltage at the output of the electrical amplifier U4 may be measured. In another example, a signal from an analog-to-digital converter that is connected to the output of the electrical amplifier U4 is obtained.

An amount of leakage current is determined based on the obtained voltage value (415). The obtained voltage value may be any voltage value that depends on the amount of leakage current flowing in the leakage current detection module 370. For example, the output of the electrical amplifier U4 may be obtained. As discussed above, the output of the electrical amplifier U4 has a continuous range of possible voltage values, with each of voltage value corresponding to an amount of leakage current. In another example, the output voltage of the electrical amplifier U4 may be provided to an analog-to-digital converter that quantizes the analog voltages at the output of the electrical amplifier U4 into discreet voltage values. Each of the discrete voltage values corresponds to an amount of leakage current. The correspondence between a voltage measured at the output of the electrical amplifier U4 and an amount of leakage current is pre-known and based on the configuration of the leakage current detection module 370. For example, the values of the resistors R17 and R19 and the characteristics of the electrical amplifier U4 determine how the output voltage of the electrical amplifier U4 relates to the amount of leakage current that flows from the LCD node 372.

In the example of FIG. 4, the leakage current that flows from the LCD node 372 is leakage current from four conductors in the cable. Thus, the leakage current that is determined based on the obtained voltage is a total leakage current sourced from four instances of the input circuit 332. The total leakage current may be divided by the number of input circuits in the low impedance mode to determine an average leakage current per conductor. The determined amount of leakage current may be the total leakage current or the average leakage current per conductor.

The determined amount of leakage current is analyzed (420). One or more characteristics of the leakage current may be determined. For example, the amplitude of the leakage current may be determined at a particular time or over a period of time. The average amount of leakage current may be determined over a period of time.

In some implementations, the determined amount of leakage current is analyzed by comparing the amount of leakage current to a threshold. The threshold is a pre-determined value that corresponds to an amount of leakage current known to indicate that the cable has maintenance issues or soon will develop maintenance issues. Additionally, the threshold may be a threshold that is based on an average amount of leakage current per conductor. The threshold may be stored on the electronic storage 124 of the control system 120 (FIGS. 1A and 1B). The electronic storage 124 may be any type of electronic memory that is capable of storing data, and the electronic storage 124 may include volatile and/or non-volatile components. The electronic storage 124 and the electronic processor 122 are coupled such that the electronic processor 122 may access or read data from the electronic storage 124 and may write data to the electronic storage 124.

The analysis of the determined amount of leakage current (420) may include other techniques. For example, the analysis may be performed using amounts of leakage current measured over a finite period of time, such as, a day, week, or month. Each of the amounts of leakage current taken at a different time is a sample of a measured amount of leakage current at a particular time. In these implementations, the analysis may include determining that a sufficient number of samples of the measured amount of leakage current exceeds the pre-determined threshold and/or that the measured amount of leakage current exceeds the pre-determined threshold repeatedly over a pre-defined time period. In some implementations, pattern recognition or template matching techniques are used to identify particular types of faults. For example, the leakage current over time may be analyzed to determine signatures for issues such as electrical arcs, or reoccurring current draws that have increasing frequency and amplitude (which indicate an impeding failure). These signatures may be stored in the electronic storage 124 of the control system 120 or at the monitoring station 180. The leakage current collected over time may be compared to these signatures such that potential failures or maintenance issues are detected early and resolved prior to damage occurring.

The determined amount of leakage current may be analyzed at the control system 120, or the determined amount of leakage current may be provided to the monitoring station 180 (FIGS. 1A and 1B) for analysis.

Regardless of the technique used to analyze the leakage current, if the analysis does not indicate that the amount of leakage current indicates that moisture is present (for example, if the determined amount of leakage current is less than the threshold), then the process 400 continues to monitor the leakage current and returns to (405). If the analysis indicates that moisture is present (for example, if the determined amount of leakage current is equal to or greater than the threshold), then an error indication is generated (430). The error indication may be generated by, for example, the electronic processor 240 and/or by the electronic processor 122 of the control system 120, and may be presented at the I/O interface 126 (FIGS. 1A and 1B). The I/O interface 126 may be any interface that allows a human operator and/or an autonomous process to interact with the control system 120. The I/O interface 126 may include, for example, a display, a keyboard, audio input and/or output (such as speakers and/or a microphone), a serial or parallel port, a Universal Serial Bus (USB) connection, and/or any type of network interface, such as, for example, Ethernet. The I/O interface 126 also may allow communication without physical contact through, for example, an IEEE 802.11, Bluetooth, or a near-field communication (NFC) connection.

The error indication may be any type of perceivable warning such as a sound, a flashing light, or a visual display presented on a computer screen that is part of the I/O interface 126. In some implementations, the error indication may be provided to a machine that is remote from the input circuit 332. For example, the error indication may be in the form of an email or a text message that is communicated to a mobile device used by an operator of the electrical apparatus 330.

Figure 5:
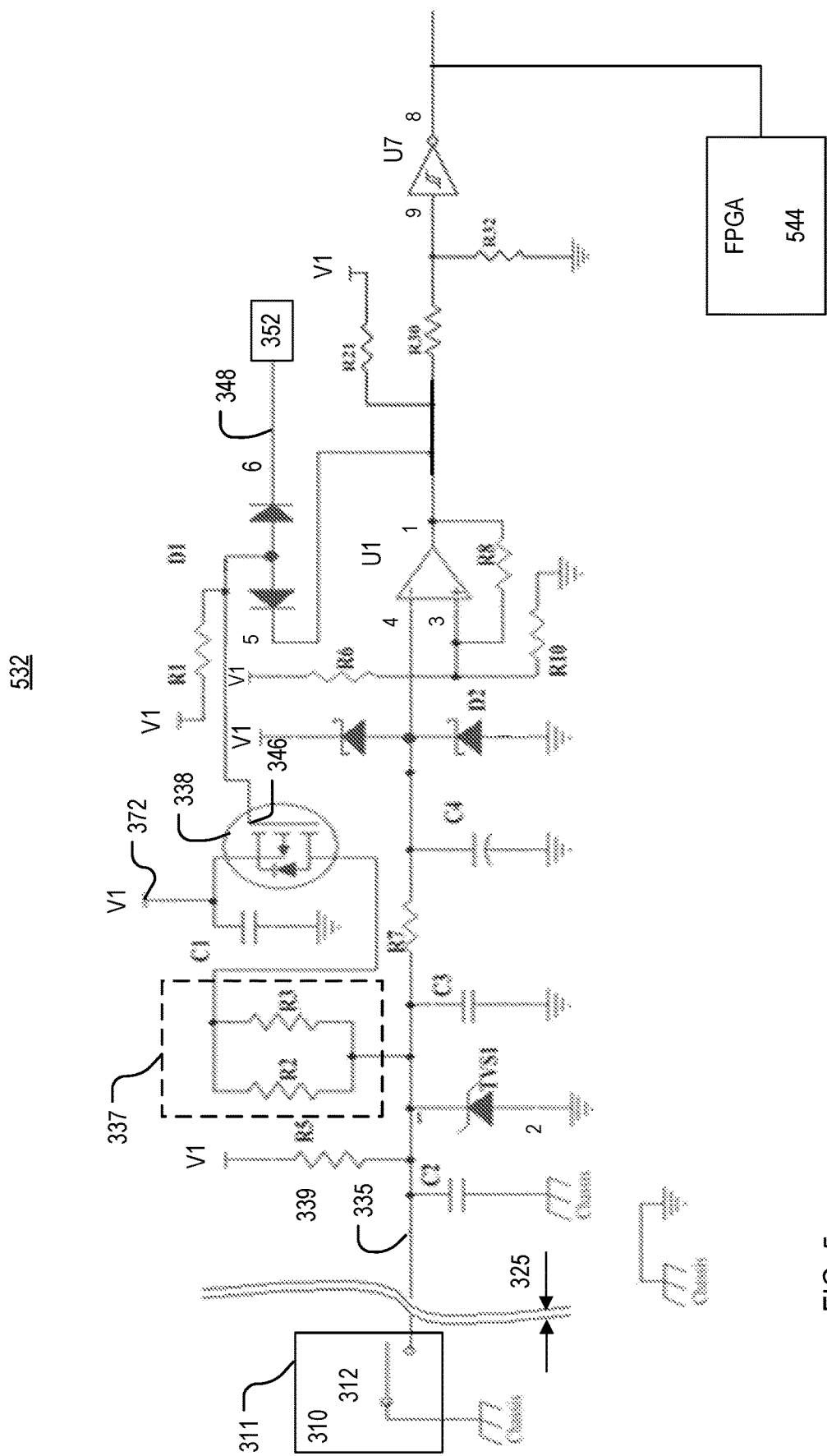
FIG. 5 is a schematic diagram of another example of an input circuit.

Referring to FIG. 5, a schematic of an input circuit 532 is shown. The input circuit 532 is another example of an implementation of the input circuit 332 of FIG. 3A. The input circuit 532 may be used as any or all of the input circuits 232_1, 232_2, . . . , 232_N in the input apparatus 230 of FIG. 2. The input circuit 532 may be used with or without one or more leakage current detection modules, such as the leakage current detection module 170 (FIGS. 1A and 1B) or 370 (FIG. 3C).

The input circuit 532 is similar to the input circuit 332 discussed above with respect to FIG. 3A. V1 in the input circuit 532 may be 24V. Instead of the optocoupler U2, the input circuit 532 includes an inverter U7 that is electrically connected to the output of the comparator U1 through a resistor network formed by resistors R21, R30, and R32. The output of the inverter U7 is high when the output of the comparator U1 is low. The output of the inverter U7 is low when the output of the comparator U1 is high. Thus, the output of the inverter U7 is high when the contact switch 312 is open, and a high output on the inverter U7 should indicate that the contact switch 312 is open. However, transient events, such as electromagnetic interference, may cause the output of the comparator U1 to falsely go low and the inverter U7 to falsely become high.

To mitigate false outputs, the inverter U7 is connected to a field programmable gate array (FPGA) 544. The FPGA 544 includes logic that is programmed to assess whether a detected opening of the contacts is due to an actual event on the distribution path 104 or is a false reading. The logic may be referred to as a "de-bounce function." The de-bounce function samples the output of the inverter U7 at periodic intervals. For example, the FPGA 544 may sample the value of the output of the inverter U7 every 250 microseconds (μs). The logic compares the sample values to a pattern of values that represent an actual transition of the contact switch 312. A valid transition is one in which the contact switch 312 opens. A valid transition causes the output of the inverter U7 to become high (for example, 1) and remain at 1 for a certain number of consecutive samples. On the other hand, an output of inverter U7 that falsely indicates that the contact switch 312 is open may appear as a single high reading followed by many consecutive zeroes.

Immediately after obtaining the first sample from the inverter U7 that is high, the de-bounce function initiates a counter to track the predetermined number of subsequent values of the inverter U7 output and to compare the sampled output values to the known pattern. Additionally, the FPGA 544 causes the electronic processor 240 to place the input circuit 532 into the low impedance mode while the de-bounce function counter is enabled. In some implementations, the FPGA 544 places the input circuit 532 in the low impedance mode directly and without using the electronic processor 240. As discussed with respect to FIGS. 3A and 3B, the trigger module 352 places the input circuit 532 in the low impedance mode by causing the control element 338 to turn ON. Placing the input circuit 532 in the low impedance mode while the output of the inverter U7 is collected and analyzed allows the analysis of the output of the inverter U7 to be performed with minimum noise. The electronic processor 240 or the FPGA 544 places the input circuit 532 into the low impedance mode for at least an amount of time determined by the sample rate and the number of samples collected to determine if the transition is a valid transition. For example, in implementations in which the sample rate is 1 sample each 250 μs, and the pattern for a valid transition is 1 "1" followed by 11 consecutive "0", the time for the de-bounce function to perform is (250 μs*11)=2.75 ms. The electronic processor 240 may extend the time during which the input circuit 532 is kept in the low impedance mode for a longer time.

FIG. 6 is a schematic of an input circuit 632. The input circuit 632 is another example of an implementation of the input circuit 132 (FIG. 1B), and the input circuit 632 may be used as any or all of the input circuits 232_1, 232_2, . . . , 232_N (FIG. 2). The input circuit 632 includes an input interface 635 that is electrically connected to a contact switch 612 via a cable 631. The contact switch 612 provides a status of an electrical apparatus, such as the electrical apparatus 110 of FIGS. 1A and 1B. The input circuit 632 provides a low input impedance when the contact switch 612 is open and a high input impedance when the contact switch 612 is closed. The input circuit 632 includes an impedance element 639 and an impedance module 637. The impedance element 639 is connected to an input interface represented as a single resistor 639. However, the impedance element 639 may be a collection of more than one resistive element arranged in any manner. When the contact switch 612 is closed, current flows into the input interface 635 (labeled as a node 635) and into the impedance element 639. Thus, when the contact switch 612 is closed, the input impedance of the input circuit 632 is the same as the impedance of the impedance element 639.

The input circuit 632 is similar to the input circuit 332 (FIG. 3A) in that the input impedance of the input circuit 632 is reduced when current flows in the impedance module 637. When current flows in the impedance module 637, the impedance element 639 and the impedance module 637 are in parallel, thus, the input impedance of the input circuit 632 is reduced and the input circuit 632 is in the low-impedance mode. However, in the input circuit 632, the impedance module 637 uses a constant current source and provides a variable impedance.

The impedance module 637 shown in FIG. 6 includes two resistors R63 and R64 connected in series with each other. The resistor R63 is connected to a drain 667 of a transistor 638. In the example shown in FIG. 6, the transistor 638 is a P-channel MOSFET. The gate of the transistor 638 is connected to a diode arrangement D60. Pin 2 of the diode arrangement D60 is connected to an output pin 12 of an inverter 670. Pin 1 of the diode arrangement D60 is connected to the trigger module 352 (FIG. 3B). To place the input circuit 632 in the low-impedance mode, the voltage at a gate 646 is controlled such that the transistor 638 operates in the Class A mode (or in the linear mode) and current flows through the impedance module 637. In this configuration, the transistor 638 forms a constant-current source with an impedance that depends on the voltage at the gate 646.

The input circuit 632 is placed in the low-impedance mode when the contact switch 612 opens. When the contact switch 612 opens, the impedance module 637 pulls the node 635 up to V1, and current flows through a resistor R60, which charges a capacitor C61 to V1. The inverter 670 has characteristics such that when pin 13 is at V1, the output of the inverter 670 is low. The low output of the inverter 670 forward biases the diode at pin 2, which causes the transistor 638 to transition from OFF to the Class A or linear mode. Thus, current flows in the transistor 638 and through the impedance module 637. Moreover, current also flows in the impedance element 639, which is placed in parallel with the impedance module 637 when the transistor 638 is not in the OFF state. Thus, the input impedance of the input circuit 632 is reduced to the impedance module 637 in series with the variable amount of impedance of the transistor 638 in parallel with the impedance element 639. Additionally, the transistor 638 may be forced from the OFF state into the Class A mode even when the contact switch 612 is closed by providing a trigger from the trigger module 352.

Other implementations are within the scope of the claims.

What is claimed is:

1. A system for an electrical power distribution network, the system comprising:
   an electrical apparatus configured to monitor or control one or more aspects of the electrical power distribution network, the electrical apparatus comprising a contact switch configured to open and close; and
   an input apparatus comprising:
      an impedance module; and
      an input interface electrically connected to the impedance module and to the contact switch of the electrical apparatus, wherein the input interface is configured to have one of a plurality of input impedances, the plurality of input impedances comprise at least a first input impedance and a second input impedance that is lower than the first input impedance, and the input interface has the second input impedance when the contact switch of the electrical apparatus is open.

2. The system of claim 1, wherein the input interface comprises a first impedance element and the impedance module comprises a second impedance element, and, when the contact switch of the electrical apparatus is open, current flows through the first impedance element and the second impedance element such that the input interface has the second input impedance.

3. The system of claim 2, wherein the impedance module further comprises an electrical switch associated with a first state in which the electrical switch conducts electrical current and a second state in which the electrical switch does not conduct electrical current, wherein current flows in the second impedance element only when the electrical switch is in the first state.

4. The system of claim 3, wherein the input apparatus further comprises an electronic processor, the electronic processor configured to provide a signal to the electrical switch, the signal being sufficient to transition the electrical switch to the first state such that the input interface has the second input impedance even if the contact switch of the electrical apparatus is closed.

5. The system of claim 4, wherein the electronic processor that is coupled to the impedance module is configured to produce the signal before an expected opening of the contact switch.

6. The system of claim 5, wherein, after the expected opening of the contact switch, the electronic processor is further configured to cause the electrical switch to transition to the second state such that the input interface has the first input impedance if the contact switch of the electrical apparatus is closed.

7. The system of claim 1, further comprising a control cable, the control cable comprising a conductor that electrically connects the input interface and the contact switch, and wherein the control system further comprises a leakage current detection module electrically coupled to the impedance module, the leakage current detection module being configured to provide an indication of an amount of electrical current that flows in the conductor.

8. The system of claim 7, wherein
the electrical apparatus comprises a plurality of contact switches,
the control cable comprises a plurality of conductors, each of the conductors being connected to one of the plurality of contact switches,
the input apparatus comprises a plurality of impedance modules and a plurality of input interfaces, each of the input interfaces is electrically connected to one of the conductors, each of the impedance modules is electrically connected to one of the plurality of input interfaces, and
all of the impedance modules are electrically connected to the leakage current detection module.

9. The system of claim 7, wherein
the electrical apparatus comprises a plurality of contact switches,
the control cable comprises a plurality of conductors, each of the conductors being connected to one of the plurality of contact switches,
the input apparatus comprises a plurality of impedance modules and a plurality of input interfaces, each of the input interfaces is electrically connected to one of the conductors, each of the impedance modules is electrically connected to one of the plurality of input interfaces,
the input apparatus comprises a plurality of leakage current detection modules, and
each of the impedance modules are electrically connected to one of the leakage current detection modules.

10. The system of claim 1, wherein the electrical apparatus is a recloser or a voltage regulator.

11. An input apparatus comprising:
a plurality of input interfaces, each of the input interfaces configured to electrically connect to a contact switch of an electrical apparatus that monitors or controls one or more aspects of an electrical power distribution network, wherein each of the input interfaces is configured have one of a plurality of impedances, the plurality of impedances comprising at least a first input impedance or a second input impedance, the second input impedance being lower than the first input impedance; and
a plurality of impedance modules, each impedance module being connected to one of the plurality of input interfaces, wherein each input interface has the second input impedance when current flows through the impedance module connected to that input interface.

12. The input apparatus of claim 11, further comprising one or more leakage current detection modules, wherein each of the one or more leakage current detection modules is electrically connected to one of the impedance modules, and is configured to measure an amount of electrical current flowing from the one of the impedance modules.

13. The input apparatus of claim 12, wherein:
the input interface is configured to receive N conductors,
N is an integer number greater than one,
the input apparatus comprises N leakage current detection modules, and
each of the N leakage current detection modules is configured to measure a leakage current that flows in one of the N conductors.

14. The input apparatus of claim 12, wherein:
the input interface is configured to receive N conductors,
N is an integer number greater than one,
the input apparatus comprises one leakage current detection module, and
the leakage current detection module is configured to measure a leakage current that flows in any of the N conductors.

15. A method of analyzing leakage current, the method comprising:
measuring an amount of leakage current that flows in a cable connecting an electrical apparatus and a control system, the control system comprising an input apparatus;
analyzing the measured amount of leakage current to determine one or more characteristics of the leakage current;
determining whether moisture is present in the cable based on the analysis; and
if moisture is determined to be present in the cable, generating an indication of an error.

* * * * *